United States Patent
Kamath et al.

(10) Patent No.: US 9,299,845 B2
(45) Date of Patent: Mar. 29, 2016

(54) DIFFUSION BARRIER COATED SUBSTRATES AND METHODS OF MAKING THE SAME

(75) Inventors: Arvind Kamath, Mountain View, CA (US); Michael Kocsis, San Francisco, CA (US); Kevin McCarthy, Milpitas, CA (US); Gloria Man Ting Wong, Mountain View, CA (US)

(73) Assignee: Thin Film Electronics ASA, Oslo (NO)

( * ) Notice: Subject to any disclaimer, the term of this patent is extended or adjusted under 35 U.S.C. 154(b) by 927 days.

(21) Appl. No.: 12/790,627

(22) Filed: May 28, 2010

(65) Prior Publication Data

US 2011/0017997 A1 Jan. 27, 2011

Related U.S. Application Data

(60) Provisional application No. 61/181,953, filed on May 28, 2009.

(51) Int. Cl.
*H01L 29/786* (2006.01)
*H01L 27/12* (2006.01)

(52) U.S. Cl.
CPC ...... *H01L 29/78603* (2013.01); *H01L 27/1218* (2013.01); *H01L 29/7869* (2013.01); *H01L 29/78681* (2013.01)

(58) Field of Classification Search
CPC .................................................. H01L 29/78603
See application file for complete search history.

(56) References Cited

U.S. PATENT DOCUMENTS

| | | | |
|---|---|---|---|
| 6,430,458 B1 | 8/2002 | Mosely et al. | |
| 7,504,336 B2 | 3/2009 | Purtell et al. | |
| 7,868,327 B2 | 1/2011 | Jeong et al. | |
| 8,446,706 B1 * | 5/2013 | Kamath et al. | 361/311 |
| 2004/0201545 A1 * | 10/2004 | Yamazaki et al. | 345/1.1 |
| 2004/0229412 A1 | 11/2004 | Wagner et al. | |

(Continued)

FOREIGN PATENT DOCUMENTS

| | | |
|---|---|---|
| CN | 1967876 A | 5/2007 |
| JP | 2003-058078 A | 2/2003 |

(Continued)

OTHER PUBLICATIONS

International Search Report and Written Opinion; International Application No. PCT/US2010/036478; Dated Jul. 26, 2010; International Searching Authority/United States, Alexandria, Virginia.

(Continued)

*Primary Examiner* — Fernando L Toledo
*Assistant Examiner* — Valerie N Newton
(74) *Attorney, Agent, or Firm* — Andrew D. Fortney; Central California IP Group, P.C.

(57) ABSTRACT

Semiconductor devices on a diffusion barrier coated metal substrates, and methods of making the same are disclosed. The semiconductor devices include a metal substrate, a diffusion barrier layer on the metal substrate, an insulator layer on the diffusion barrier layer, and a semiconductor layer on the insulator layer. The method includes forming a diffusion barrier layer on the metal substrate, forming an insulator layer on the diffusion barrier layer; and forming a semiconductor layer on the insulator layer. Such diffusion barrier coated substrates prevent diffusion of metal atoms from the metal substrate into a semiconductor device formed thereon.

48 Claims, 3 Drawing Sheets

(56) References Cited

U.S. PATENT DOCUMENTS

| | | | |
|---|---|---|---|
| 2006/0216410 A1* | 9/2006 | Schaepkens et al. | 427/66 |
| 2007/0108472 A1* | 5/2007 | Jeong et al. | 257/192 |
| 2007/0235777 A1* | 10/2007 | Nagata | 257/288 |
| 2007/0246735 A1 | 10/2007 | Yahata et al. | |
| 2007/0287237 A1 | 12/2007 | Rockenberger et al. | |
| 2008/0044964 A1 | 2/2008 | Kamath et al. | |
| 2008/0050868 A1* | 2/2008 | Lee et al. | 438/199 |
| 2009/0085095 A1 | 4/2009 | Kamath et al. | |
| 2009/0095996 A1* | 4/2009 | Chung et al. | 257/296 |
| 2010/0051328 A1* | 3/2010 | Tain et al. | 174/255 |
| 2010/0210060 A1* | 8/2010 | Borden et al. | 438/61 |
| 2010/0229928 A1* | 9/2010 | Zuniga et al. | 136/255 |
| 2011/0189810 A1* | 8/2011 | Rubin et al. | 438/72 |

FOREIGN PATENT DOCUMENTS

| | | |
|---|---|---|
| JP | 2004-048005 A | 2/2004 |
| JP | 2007-142367 A | 6/2007 |

OTHER PUBLICATIONS

Extended European Search Report dated Sep. 4, 2013; EP Application No. 10781242.2; European Patent Office.

Written Opinion of the International Preliminary Examining Authority; International Application No. PCT/US2010/036478; Dated Oct. 23, 2012; 5 pages; International Preliminary Examining Authority / United States, Commissioner for Patents, Alexandria, Virginia.

Office Action for Japanese Patent Appl. No. 2012-513271; dated Apr. 22, 2014.

Chinese Office Action with partial English translation dated May 6, 2015; Chinese Patent Application No. 201080023017.9; 12 pgs.; State Intellectual Property Office of People's Republic of China.

Jae K. Jeong, Hyun S. Shin, Se Y. Kwon and Yeon G. Mo; "Thin Film Transistor and Method of Manufacturing the Same"; May 23, 2007; Abstract of CN1967876 (A); http://worldwide.espacenet.com.

* cited by examiner

DIFFUSION BARRIER COATED SUBSTRATES AND METHODS OF MAKING THE SAME

RELATED APPLICATIONS

This application claims the benefit of U.S. Provisional Patent Application No. 61/181,953, filed May 28, 2009, which is incorporated herein by reference in its entirety.

FIELD OF THE INVENTION

The present invention generally relates to the field of semiconductor devices. More specifically, embodiments of the present invention pertain to semiconductor devices on diffusion barrier coated metal substrates and methods for making the same.

DISCUSSION OF THE BACKGROUND

The use of metal foil substrates (e.g., stainless steel, aluminum, copper, etc.) in the construction of semiconductor devices enables the fabrication of semiconductor products that can be flexible. In addition, the use of metal foil substrates allows for high temperature processing of electrical device layers, features and/or devices formed thereon, without significant degradation of the properties of the metal foil substrate. However, at elevated temperatures, components of a metal foil substrate (e.g., in the case of a stainless steel substrate, atoms of iron and/or of an alloying element such as chromium, nickel, molybdenum, niobium, etc.) may have a high enough diffusivity that they may diffuse from the metal foil substrate into one or more electrical device (e.g., semiconductor or dielectric) layer(s), feature(s) and/or device(s) formed thereon, thereby compromising its electrical properties.

For example, referring to FIG. 1, an exemplary semiconductor device, thin-film transistor (TFT) 5, is shown. An insulating layer 20 lies between metal foil substrate 10 and semiconductor body 30. Semiconductor body 30 has source/drain regions 60 and 70 formed therein, and a gate stack comprising gate dielectric 40 and gate electrode 50 formed thereon. During an annealing step, TFT 5 on substrate 10 may be heated to a temperature sufficient to activate a dopant in source/drain regions 60 and 70 and/or at least partially crystallize semiconductor body 30. Such elevated temperatures (e.g., >350° C., and particularly >600° C.) may increase the mobility of metal atoms in the metal foil substrate 10 sufficiently to enable the diffusion lengths of the metal atoms to be comparable to the insulator thickness. Diffusion of metal atoms from substrate 10, through insulator layer 20, as shown by arrows 80, into the active region(s) of TFT 5 (e.g., a channel region of semiconductor body 30 and/or source/drain regions 60 and 70) and/or gate dielectric region 40 may degrade the operating characteristics of TFT 5 (e.g., the threshold voltage, subthreshold slope, leakage current and/or on-current of TFT 30). Therefore, it is desirable to provide a diffusion barrier between metal substrate 10 and semiconductor layer 30 (or other device layer) formed thereon, to prevent such diffusion of metal atoms from substrate 10, through insulator layer 20, into the active region of TFT 5 and/or into gate dielectric region 40 thereover. It is also desirable to provide a diffusion barrier between metal substrate 10 and any device layer thereover in other devices, such as capacitors, diodes, inductors, resistors, etc., where the addition of metal atoms may cause an undesirable change in properties of the device layer.

SUMMARY OF THE INVENTION

In a one aspect, the present invention relates to a electrical device on a diffusion barrier coated metal substrate, comprising a metal substrate, one or more diffusion barrier layer(s) on the metal substrate, one or more insulator layer(s) on the diffusion barrier layer, and a semiconductor or other device layer on the insulator layer.

In another aspect, the present invention relates to a method of making an electrical device on a metal substrate, comprising forming one or more diffusion barrier layer(s) on the metal substrate, forming one or more insulator layer(s) on the diffusion barrier layer; and forming a semiconductor or other device layer on the insulator layer.

The present invention advantageously provides electrical devices on a diffusion barrier coated metal substrate and methods for making the same. The diffusion barrier prevents diffusion of metal atoms from the metal substrate into an electrical device formed thereon. These and other advantages of the present invention will become readily apparent from the detailed description below.

DETAILED DESCRIPTION

Reference will now be made in detail to the various embodiments of the invention, examples of which are illustrated in the accompanying drawings. While the invention will be described in conjunction with the following embodiments, it will be understood that the description is not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail, so as not to unnecessarily obscure aspects of the present invention.

In one aspect, the present invention concerns an electrical device on a diffusion barrier coated metal substrate, comprising a metal substrate, at least one diffusion barrier layer on the substrate, at least one insulator layer on the diffusion barrier layer, and at least one device layer (e.g., a semiconductor layer) on the insulator layer. In another aspect, the present invention relates to a method of making a electrical device on a diffusion barrier coated metal substrate, comprising forming at least one diffusion barrier layer on the metal substrate, forming at least one insulator layer on the diffusion barrier layer; and forming at least one device layer (e.g., a semiconductor layer) on the insulator layer.

The invention, in its various aspects, will be explained in greater detail below with regard to an exemplary method for making an electrical device on a diffusion barrier coated metal substrate.

Exemplary Devices on Barrier-Coated Metal Substrates

Figure 1:
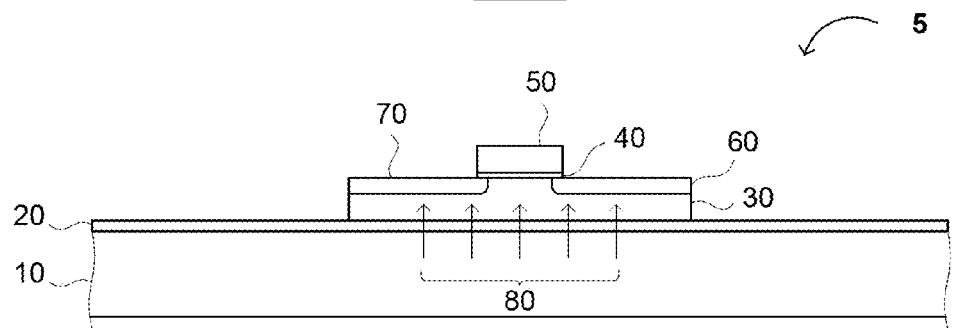
FIG. 1 shows a TFT on an insulator-coated metal substrate.
Figure 2A:
FIGS. 2A-2E illustrate structures formed in an exemplary method for manufacturing a TFT on a diffusion barrier-coated metal substrate according to embodiments of the invention.

Referring now to FIG. 2A, metal substrate 210 may comprise a slab, foil or sheet of stainless steel (of any grade, e.g., Type 304, Type 316, etc.) or of any other suitable elemental metal or alloy with a softening temperature sufficiently high to withstand typical processing temperatures associated with the manufacture of electrical devices (e.g., greater than about 350° C., or any value above 350° C. but below the softening temperature of the substrate). In one embodiment, the metal is Type 304 stainless steel, although any stainless steel alloy can be used. Alternatively, the metal substrate 210 can comprise a slab, foil or sheet of aluminum, copper, titanium or molybdenum, for example. The metal substrate 210 may have a thickness of from about 10 μm to about 1000 μm (e.g., 10 μm to 500 μm, 50 to 200 μm, or any other value or range of values therein). Metal substrate 210 may have essentially any shape, such as square, circular, oval, oblong, etc. Alternatively, the metal substrate 210 may have a predetermined irregular and/or patterned shape. In some embodiments, metal substrate 210 may be square or rectangular, or a sheet of x-by-y square or rectangular units, or an x-unit wide roll, where each unit represents an individual, separable substrate for a single integrated circuit (e.g., display device, solar cell, identification tag, etc.).

Metal substrate 210 is generally cleaned prior to deposition of diffusion barrier layer 220. Such cleaning may remove, e.g., residue from processing the stock from which metal substrate 210 is prepared, residual organic material, particles and/or other contaminants which may adversely affect the adhesion of diffusion barrier layer 220 to the surface(s) of metal substrate 210. Cleaning the metal substrate 210 may comprise wet cleaning and/or dry cleaning In one example, e.g., cleaning comprises etching the surface of the substrate 210, optionally followed by rinsing and/or drying the substrate 210.

Suitable etching techniques may include wet etching processes (e.g., wet chemical etching), or dry etching (e.g., reactive ion etching [RIE] or sputter etching). In one embodiment, metal substrate 210 is cleaned by immersing the substrate in and/or rinsing the substrate with a liquid-phase cleaner (e.g., that removes organic residue), followed by wet etching using a dilute aqueous acid (e.g., dil. aq. HF, which may be buffered with ammonia and/or ammonium fluoride). Alternative acids for use in wet etching the substrate 210 include nitric acid, sulfuric acid, hydrochloric acid, etc., depending on the grade of steel or other metal used and the temperature at which the metal substrate 210 will be processed. In another embodiment, metal substrate 210 is cleaned by sputter etching. The selection of gas(es) for use in a dry etching process to clean metal substrate 210 is not particularly limited. Any gas or combination of gases that removes substantially all undesired contaminants from the surface of metal substrate 210, but does not leave an unremovable residue, may be employed. For example, an inert gas such as argon may be employed in sputter cleaning of the metal substrate 210.

After etching, the metal substrate 210 may be rinsed (e.g., with deionized water), then optionally further cleaned by immersing and/or rinsing with an organic solvent or solvent mixture to remove undesired organic residue that may be present on the surface of the metal substrate 210. Alternatively, such further cleaning may comprise immersing and/or rinsing with an aqueous solution or suspension of a surfactant (followed by rinsing with deionized water). For example, further cleaning may comprise treating the metal substrate 210 with a cleaning solvent that does not chemically attack steel, such as $C_6$-$C_{12}$ alkanes (which may be substituted with 1 or more halogens), $C_1$-$C_6$ alkyl esters of $C_2$-$C_{20}$ alkanoic acids, $C_2$-$C_6$ dialkyl ethers, methoxy-$C_4$-$C_6$ alkanes, $C_2$-$C_4$ alkylene glycols and $C_1$-$C_4$ alkyl ethers and/or $C_1$-$C_4$ alkyl esters thereof, $C_6$-$C_{10}$ arenes (which may be substituted with 1 or more $C_1$-$C_4$ alkyl groups, $C_1$-$C_4$ alkoxy groups, and/or halogens), and $C_2$-$C_6$ alkylene or dialkylene ethers, thioethers (including sulfoxide and sulfone derivatives of such thioethers) and esters (such as tetrahydrofuran, dioxane, γ-propiolactone, δ-butyrolactone, and tetramethylene sulfone). In one example, the cleaning solvent comprises a mixture of dipropylene glycol methyl ether acetate (DPGMEA) and/or tetramethylene sulfone (e.g., KWIK STRIP cleaner, available from AZ Electronic Materials, Branchburg, N.J., which contains a mixture of 65-70% DPGMEA and 35-40% tetramethylene sulfone).

In some embodiments, cleaning the metal substrate 210 is performed on a stock roll or sheet of metal from which metal substrate 210 is formed, before cutting or forming metal substrate 210 into its final shape, for ease of handling and processing. However, in other embodiments, metal substrate 210 may be cut or formed prior to cleaning.

Figure 2B:
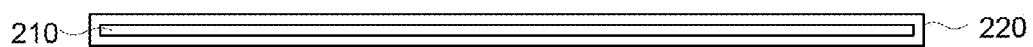

Referring now to FIG. 2B, after cleaning metal substrate 210, diffusion barrier layer 220 is formed thereon. The diffusion barrier layer 220 preferably has a thickness greater than the total diffusion length of the diffusing species (e.g., from the metal substrate 210) for a given time and temperature. For example, the total diffusion length can be measured as the product of (1) diffusivity of the diffusing species (at a certain/predetermined processing temperature) through the diffusion barrier layer and any other layer between the layer containing the diffusing species and the layer to be protected (e.g., an overlying device layer), and (2) the length of time that the structure is exposed to the certain/predetermined processing temperature. In various embodiments, the thickness of the diffusion barrier layer 220 is greater than the diffusion length of each diffusing species of concern by at least 5%, 10% or more. This way, even at relatively low processing temperatures, a diffusion barrier layer 220 can be designed to provide adequate protection against adverse effects of diffusing species at a minimal cost and/or impact to the overall manufacturing process. One particular function of the diffusion barrier is to decrease the diffusivity of the diffusing species (e.g., metal atoms from substrate) by a relatively large amount (typically one or more orders of magnitude) as compared to the diffusivity of a diffusing species in any layer of the device above the diffusion barrier. Diffusion barrier layer 220 may comprise, for example, a tungsten or titanium alloy such as tungsten-tantalum alloy or tungsten-titanium alloy, or a titanium or aluminum compound such as titanium nitride, aluminum nitride, or titanium aluminum nitride. Alternatively, diffusion barrier layer 220 may comprise an insulating barrier such as silicon oxide, silicon nitride, silicon oxynitride (i.e., $Si_xO_yN_z$, where x=2y+[4z/3]), alumina, titania, germania ($GeO_2$), hafnia, zirconia, ceria, and/or other rare earth oxides, including combinations thereof and nanolaminates thereof.

Compounds including titanium nitride and/or aluminum nitride provide a relatively inexpensive barrier layer that is amenable to many different methods of deposition. In certain embodiments, diffusion barrier layer 220 comprises a titanium compound of the formula $Ti_xN_y$, where the ratio of x to y is from about 3:4 to about 3:2. In one example, x and y are each about 1. In other embodiments, diffusion barrier layer 220 comprises a titanium aluminum nitride of the formula $Ti_aAl_bN_c$, where the ratio of (a+b) to c is from about 3:4 to about 3:2. Generally, the ratio of a to b is from about 1:10 to about 10:1 (or any range therein). In one example, a+b≈c, and c=1. Criteria for a suitable compound(s) for use in diffusion barrier layer 220 generally include (i) a high degree of resistance to diffusion of components from metal substrate 210, (ii) thermal stability up to the maximum processing temperature for the devices and/or structures formed thereon (e.g., greater than about 350° C., or any value above 350° C., but optionally, less than the softening temperature of the metal substrate), (iii) adhesive characteristics such that diffusion barrier layer 220 adheres to metal substrate 210, and insulator layer 230 adheres to diffusion barrier layer 220, (iv) optical properties (e.g., an optical constant and/or reflectivity) sufficient to enable facile inspection and/or establishment and/or detection of process windows, and/or (v) a residual stress and thickness such that the diffusion barrier layer 220 does not delaminate during high temperature processing (e.g., >350° C.). Thus, the stoichiometry (e.g., the values of x and y, or the values of a, b and c) of the tungsten alloy or titanium and/or aluminum compound employed may be selected to optimize one or more of these criteria.

Diffusion barrier layer 220 may be formed by employing well known techniques such as physical vapor deposition, chemical vapor deposition, or atomic layer deposition of suitable precursors onto metal substrate 210 in a deposition chamber. In certain embodiments, diffusion barrier layer 220 comprises titanium nitride formed by, e.g., atomic layer deposition of titanium and nitrogen from precursors such as $TiCl_4$ and $NH_3$, $Ti(NMe_2)_4$ (TDMAT), or $Ti(NEt_2)_4$ (TDEAT). In other embodiments, the titanium nitride is formed by sputter deposition from a titanium target in a nitrogen- and/or ammonia-containing atmosphere. Alternatively, titanium nitride can be formed by chemical vapor deposition from precursors such as $TiMe_4$ or $TiEt_4$ and $N_2$ and/or $NH_3$. The stoichiometry (e.g., the values of x and y) of CVD titanium nitride (i.e., of the formula $Ti_xN_y$) may be controlled by controlling the relative amounts of titanium and nitrogen precursors introduced into the deposition chamber during the deposition of diffusion barrier layer 220.

In other embodiments, diffusion barrier layer 220 comprises titanium aluminum nitride formed by, e.g., atomic layer deposition of a mixture of titanium and nitrogen precursors as described above, alternating with an aluminum precursor of the formula $AlH_nR_m$ (and, optionally, $N_2$ and/or $NH_3$), where R is a $C_1$-$C_4$ alkyl group and n+m=3. Suitable aluminum precursors include alane ($AlH_3$), alane-ammonia complex ($AlH_3 \cdot NH_3$), alane-trimethylamine complex ($AlH_3 \cdot NMe_3$), tri-isobutyl aluminum (TIBAL), trimethyl aluminum (TMA), triethyl aluminum (TEA), or dimethylaluminum hydride (DMAH). The stoichiometry of the titanium aluminum nitride (i.e., the values of a, b and c in the formula $Ti_aAl_bN_c$) may be controlled by controlling the relative amounts of titanium, aluminum and nitrogen precursors introduced into the deposition chamber during the deposition of diffusion barrier layer 220.

Diffusion barrier layer 220 (see FIG. 2B) may have a thickness of from about 1 nm to about 1 μm (e.g., from about 5 nm to 500 nm, from about 10 nm to about 250 nm, or any other value or range of values therein). In one embodiment, the diffusion barrier layer 220 has a thickness of from about 30 nm to about 150 nm. Alternatively, when the diffusion barrier layer 220 comprises alternating titanium nitride and aluminum nitride layers deposited by ALD, there may be from 2 to 10,000 layers (or any range of values therein), and each of the titanium nitride and aluminum nitride layers may have a thickness of from 5 to 1200 Å. In further embodiments, alternating layers of conducting and insulating diffusion barrier materials, or of two or more different insulating diffusion barrier materials, may be used. Any such combination of alternating layers or nanolaminates, made by any of the methods disclosed herein or otherwise known in the art, having properties sufficient to prevent diffusion of metal atoms into overlying device layers may be employed.

In certain embodiments, diffusion barrier 220 substantially encapsulates the metal substrate 210. For example, as shown in FIG. 2B, if metal substrate 210 is singulated, cut or formed prior to or after a cleaning step, but before depositing the diffusion barrier layer 220, the diffusion barrier layer 220 may substantially encapsulate metal substrate 210, including the edges (in addition to the major surfaces).

Optionally, either prior to or after depositing the diffusion barrier layer 220, an antireflective coating (not shown) may be blanket-deposited (e.g., either onto the metal substrate 210 or onto the diffusion barrier layer 220). The antireflective coating may comprise an inorganic insulator, such as silicon oxide, silicon nitride, silicon oxynitride, alumina, titania, germania ($GeO_2$), hafnia, zirconia, ceria, one or more other metal oxides, or a combination and/or nanolaminate thereof, and may be deposited by physical vapor deposition (PVD), chemical vapor deposition (CVD), liquid deposition (e.g., coating or printing), or atomic layer deposition (ALD) from suitable precursors as described herein. The antireflective coating may have a thickness of from 50 Å to 1000 Å (e.g., 50 to 200 Å, or any other range of values therein). In one embodiment, the antireflective coating comprises a layer of silicon dioxide, deposited by ALD (see, e.g., U.S. patent application Ser. No. 12/249,841, filed Oct. 10, 2008, the relevant portions of which are incorporated herein by reference).

In addition, prior to depositing the diffusion barrier layer 220 and the antireflective coating, a stress relief layer (not shown) may be blanket-deposited onto the substrate 210. The stress relief layer may comprise an organic or inorganic material capable of reducing the stress imparted onto the substrate 210 and any insulator or antireflective coating thereon by overlying layers of material (such as the barrier layer 220). The stress relief layer may comprise an organic polymer, such as a poly(acrylic acid ester), poly(methacrylic acid ester), or copolymer thereof (e.g., with an olefin such as ethylene, propylene, butylene, etc.), which may be deposited by spin-coating, printing, dip-coating, etc. Alternatively, the stress relief layer may comprise an oxide-based insulator (e.g., silicon dioxide, aluminum oxide) and/or an elemental metal, such as aluminum, titanium, copper, etc. (and alloys thereof), which may be deposited by physical vapor deposition (PVD), chemical vapor deposition (CVD), liquid deposition, or atomic layer deposition (ALD) from a suitable precursor as described herein. Inorganic materials such as oxide-based insulators and elemental metals and alloys are preferred for compatibility with high-temperature processing. Each stress relief layer may have a thickness of from 5 Å to 1000 Å (e.g., 10 to 250 Å, or any other range of values therein). In one embodiment, the stress relief layer comprises a $SiO_2$:Al insulating layer (also known as a mixed $SiO_2$:$Al_2O_3$ oxide), having a thickness of 10-250 Å. In another embodiment, the stress relief layer comprises aluminum, deposited by PVD (e.g., sputtering), and has a thickness of from 50 Å to 100 Å (or any range of values therein). Together, in one example, the antireflective coating and the stress relief layer have a combined thickness of about 150 Å.

Figure 2C:
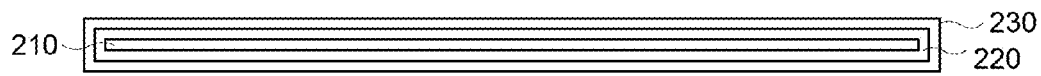

Referring now to FIG. 2C, an insulator layer 230 is formed on the diffusion barrier layer 220. Insulator layer 230 may comprise any material that electrically insulates diffusion barrier layer 220 from subsequent electrical device features and/or devices that may be subsequently formed thereon. For example, insulator layer 230 may comprise silicon oxide, silicon nitride, silicon oxynitride, aluminum oxide, aluminum nitride, or combinations thereof. In one embodiment, the insulator layer 230 comprises silicon dioxide and aluminum oxide.

Insulator layer 230 may be formed by physical vapor deposition, chemical vapor deposition, atomic layer deposition, or liquid phase deposition (e.g., spincoating and curing, such as is used in a spin-on-glass process). For example, in certain embodiments, insulator layer 230 comprises silicon dioxide, and may be formed by chemical vapor deposition (e.g., plasma enhanced CVD) from a silicon source such as tetraethyl orthosilicate (TEOS) or a silane (e.g., $SiH_4$ or $SiCl_2H_2$) and an oxygen source (e.g., $O_2$, $O_3$, $N_2O$, NO, etc.). In other embodiments, insulator layer 230 comprises silicon nitride, and may be formed by chemical vapor deposition from a silicon source (e.g., $SiH_4$ or $SiCl_2H_2$) and a nitrogen source (e.g., $NH_3$ and/or $N_2$). In additional embodiments, insulator layer 230 comprises silicon oxynitride, and may be formed by chemical vapor deposition from a silicon source (e.g., $SiH_4$), a source of nitrogen and oxygen (e.g., $NO_2$, NO, and/or $N_2O$), or a nitrogen source (e.g., $NH_3$ and/or $N_2$) and an oxygen source (e.g., $O_2$, $O_3$, and/or $N_2O$). In still other embodiments, insulator layer 230 may comprise aluminum oxide and/or aluminum nitride, which may be formed by atomic layer deposition from an aluminum source (e.g., trimethyl aluminum or other aluminum source as described herein) and an oxygen source (e.g., $O_2$, $O_3$, and/or water), a nitrogen source (e.g., $NH_3$ and/or $N_2$) and/or a source of nitrogen and oxygen (e.g., $NO_2$, NO, and/or $N_2O$). Insulator layers can be formed by atomic layer deposition as described in U.S. patent application Ser. No. 12/249,841, filed Oct. 10, 2008, the relevant portions of which are incorporated herein by reference.

Insulator layer 230 may be formed in the same deposition chamber as that employed to deposit the diffusion barrier layer 220, optionally immediately after deposition of the diffusion barrier layer 220. Alternatively, the insulator layer 230 may be formed in a separate step and/or in a separate chamber from the diffusion barrier layer 220. Insulator layer 230 (see FIG. 2C) may have a thickness of from about 10 nm to about 10 μm (e.g., from about 50 nm to 5 μm, from about 100 nm to about 2 μm, or any other value or range of values therein). In one embodiment, insulator layer 230 has a thickness of about 1 μm.

Insulator layer 230 may also be formed by coating or printing (e.g., spincoating, inkjetting, dropcasting, gravure printing, flexographic printing, spray coating, screen printing, offset printing, spin coating, slit coating, extrusion coating, dip coating, meniscus coating, microspotting, pen-coating, stenciling, stamping, syringe dispensing, pump dispensing, etc., of an ink including an insulator precursor; see, e.g., U.S. patent application Ser. No. 12/625,492, filed Nov. 24, 2009, the relevant portions of which are incorporated herein by reference). In some embodiments, insulator layer 230 may be formed by printing (e.g., screen printing, gravure printing, offset printing, inkjet printing, etc.) an ink or composition containing an insulator or insulator precursor. Generally, after printing an insulator- and/or insulator precursor-containing ink or composition, the printed layer is heated to a temperature of about 50-150° C. (optionally under vacuum) to remove any solvent from the printed ink or composition, then further heated or cured (e.g., at a temperature of about 300-600° C., optionally under an oxidizing or inert atmosphere) to form insulator layer 230.

In a further embodiment (not shown), the coated substrate may further comprise successive alternating diffusion barrier and insulating layers. In such as embodiment, the coated substrate may comprise at least two diffusion barrier layers and at least two insulating layers in alternating order (e.g., a lowermost diffusion barrier layer, followed by a lower insulating layer, followed by an upper diffusion barrier layer, and an uppermost insulating layer thereon). In further embodiments, there may be 3, 4 or more (up to, for example, 100, 1000 or 10,000) alternating layers of each of the diffusion barrier material and the insulating material. Each of the diffusion barrier layers may be the same as or different from other diffusion barrier layers, and each of the insulating layers may be the same as or different from other insulating layers. Each diffusion barrier layer and each insulating layer may have a thickness of from about 0.5 nm to about 2 μm (e.g., from about 2 nm to 1 μm, from about 5 nm to about 250 nm, or any other value or range of values therein). The diffusion barrier and insulating layers may be deposited by ALD, PVD (e.g., sputtering), CVD, or any other deposition method described herein or otherwise used in the art.

Figure 2D:
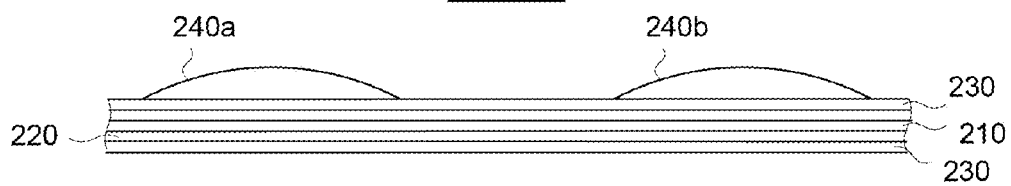

Referring now to FIG. 2D, the method further comprises forming a device layer (e.g., a semiconductor layer) 240 on insulator layer 230. When the devices on the substrate 210 include CMOS transistors (i.e., at least one NMOS transistor and at least one PMOS transistor), the device layer 240 may comprise one or more first transistor islands 240a, comprising a semiconductor material (e.g., silicon) having a first conductivity type (e.g., either NMOS or PMOS), and one or more second transistor islands 240b, comprising the same or different semiconductor material, but having a second conductivity type (e.g., the remaining one of NMOS and PMOS). Alternatively, the device layer 240 may comprise one or more gate electrodes (i.e., a "bottom gate" architecture), in which a first gate electrode 240a may have a first composition (e.g., a first semiconductor material having a first conductivity type) or a first set of properties (e.g., a metal having a first pattern or a first set of dimensions), and a second gate electrode 240b may have a second composition (e.g., a second semiconductor material having a second conductivity type) or a second set of properties (e.g., a metal having a second pattern or a second set of dimensions). In further embodiments, the device layer 240 may comprise one or more capacitor plates, one or more diode layers, one or more resistors or interconnects, etc.

In some embodiments, device layer 240 comprises silicon and/or germanium. However, when device layer 240 comprises a semiconductor material, device layer 240 is not limited to silicon and/or germanium, and may comprise a type III-V semiconductor (e.g., GaAs, InP, and related compounds and/or alloys), a type II-VI semiconductor (e.g., ZnO, ZnS, ZnSe, CdTe, and related compounds and/or alloys), an organic semiconductor (e.g., a poly[thiafulvalene-based semiconductor]), or any other suitable semiconductor material compatible with the present method. In certain embodiments, the device layer 240 may comprise amorphous, microcrystalline and/or polycrystalline silicon, germanium, or silicon-germanium. When the device layer 240 comprises silicon-germanium, the ratio of silicon to germanium may be from about 10,000:1 to about 1:1 (or any range of values therein). Device layer 240 may further comprise a dopant, such as B, P, As or Sb. In one embodiment, device layer 240 comprises polysilicon doped with boron or phosphorus. In another embodiment, device layer 240 comprises a first polysilicon island 240a doped with phosphorous and a second polysilicon island 240b doped with boron.

In some embodiments, the device layer 240 may be formed by printing (as described herein). For example, undoped and/or doped semiconductor precursor inks comprising undoped and/or doped polysilanes, heterocyclosilanes, and/or undoped and/or doped semiconductor nanoparticles may be deposited or printed by a suitable printing method (e.g., inkjet printing, offset lithography, screen printing, etc.) in a desired pattern on insulator layer 230, then cured and/or annealed to form device layer 240. Semiconductor precursor inks comprising polysilanes are described in U.S. Pat. Nos. 7,422,708, 7,553,545, 7,498,015, and 7,485,691, and U.S. patent application Ser. No. 11/867,587, filed Oct. 4, 2007, the relevant portions of each of which are incorporated herein by reference. Semiconductor precursor inks comprising heterocyclosilanes are described in U.S. Pat. No. 7,314,513 and U.S. patent application Ser. Nos. 10/950,373 and 10/956,714, respectively filed Sep. 24, 2004 and Oct. 1, 2004, the relevant portions of each of which are incorporated herein by reference. Semiconductor precursor inks comprising doped polysilanes are described in U.S. patent application Ser. No. 11/867,587, filed Oct. 4, 2007, the relevant portions of which are incorporated herein by reference. Semiconductor precursor inks comprising undoped and/or doped semiconductor nanoparticles are described in U.S. Pat. Nos. 7,422,708 and 7,553,545, the relevant portions of which are incorporated herein by reference. Alternatively, device layer 240 can be formed by one or more conventional thin-film processes or techniques.

Figure 2E:
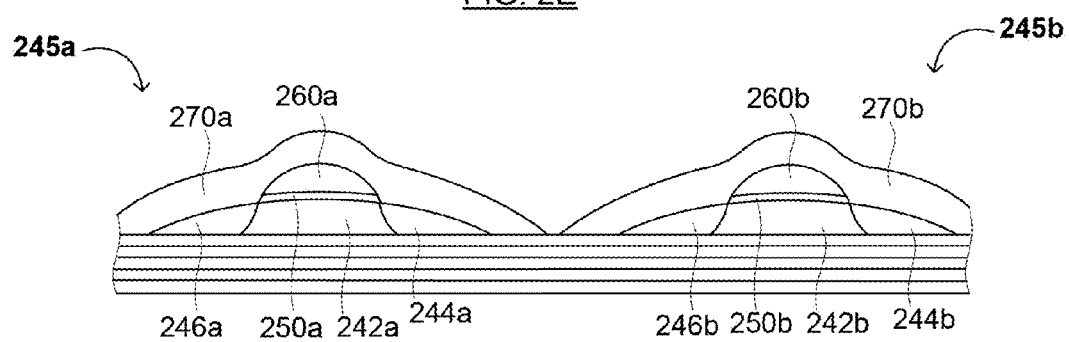

FIG. 2E illustrates exemplary semiconductor devices, thin-film transistors (TFTs) 245a-b, formed in accordance with the present methods. Each of TFTs 245a-b generally comprise a semiconductor layer (e.g., comprising a transistor channel 242a-b, a first source/drain terminal 244a-b, and a second source/drain terminal 246a-b); a gate insulator layer 250a-b on or over at least part of the semiconductor layer; a gate metal layer 260a-b on the gate insulator layer 250a-b; one or more dielectric layers on the semiconductor layer and the gate metal layer 260a-b; and a plurality of metal conductors [not shown] in electrical communication with the gate metal layer 260a-b and the source/drain terminals 244a-b and 246a-b). Exemplary semiconductor, dielectric and metal layers suitable for the TFTs, and materials and methods for forming such TFTs, are described in greater detail in U.S. Pat. No. 7,619,248 and U.S. patent application Ser. Nos. 11/203,563, 11/243,460, 11/452,108, 11/888,949, 11/888,942, 11/818,078, 11/842,884, 12/175,450, 12/114,741, 12/131,002 and 12/243,880, respectively filed on Aug. 11, 2005, Oct. 3, 2005, Jun. 12, 2006, Aug. 3, 2007, Aug. 3, 2007, Jun. 12, 2007, Aug. 21, 2007, Jul. 17, 2008, May 2, 2008, May 30, 2008, Oct. 1, 2008, the relevant portions of each of which are incorporated herein by reference.

In TFTs 245a-b, gate dielectric 250a-b is formed on semiconductor islands 240a-b. In some embodiments, gate dielectric 250a-b may be formed via a printing process (e.g., printing of a silicon dioxide precursor, such as a hydrosiloxane or hydrosilicic acid; see, e.g., U.S. Pat. No. 7,709,307 or U.S. patent application Ser. No. 12/625,492, filed Nov. 24, 2009, the relevant portions of which are incorporated herein by reference). Gate dielectric 250a-b may be formed by printing a suitable dielectric precursor, such as a molecular, organometallic, polymeric and/or nanoparticle precursor in a solvent or solvent mixture in which the dielectric precursor is soluble. Alternatively, gate dielectric 250 may be formed by blanket deposition (e.g., CVD or PVD) and/or thermal oxidation of semiconductor layer 240. For example, gate dielectric 250a-b may be formed by a conventional method (e.g., chemical vapor deposition of a silicon oxide or oxidation of a surface of the semiconductor islands 240a-b to form an oxide film). Where semiconductor layer 240 comprises a first polysilicon island 240a doped with a first dopant having a first conductivity type (e.g., phosphorous) and a second polysilicon island 240b doped with a second dopant having a second conductivity type (e.g., boron), gate dielectric layer 250a may have a slightly different thickness than gate dielectric layer 250b due to different oxidation rates of the differently doped semiconductor islands.

Gate electrodes 260a-b may then be formed on gate dielectric 250a-b. Gate electrodes 260a-b may be formed by conventional deposition methods (e.g., chemical vapor deposition, physical vapor deposition, sputtering, atomic layer deposition, etc.) of a Group 4, 5, 6, 7, 8, 9, 10, 11, or 12 metal or a semiconducting material (e.g., silicon, germanium, etc.) onto gate dielectric layer 250a-b, followed by photolithography. In some embodiments, forming gate electrode 260 may comprise coating or printing an ink composition comprising a metal precursor, in which the metal precursor comprises one or more Group 4, 5, 6, 7, 8, 9, 10, 11, or 12 metal salts, complexes, clusters and/or nanoparticles in a solvent or solvent mixture adapted to facilitate coating and/or printing of the metal precursor. In certain embodiments, the metal precursor comprises a metal salt, compound and/or complex having one or more ligands bound thereto that form gaseous or volatile byproducts upon reduction of the metal salt, compound and/or complex to an elemental metal and/or alloy thereof. The metal precursor composition may further comprise one or more additives (e.g., one or more reducing agents) that can also form gaseous or volatile byproducts upon reduction of the metal salt, compound and/or complex to an elemental metal and/or alloy. Such metal formulations enable the printing of a pure metal film using metal precursor(s) and reducing agent(s) that generally do not leave substantially adverse levels of impurities and/or residues in the film. For additional details, see U.S. patent application Ser. No. 12/131,002, filed May 30, 2008, the relevant portions of which are incorporated herein by reference. Following coating or printing the ink composition, the metal precursor may be further patterned by photolithography.

Source and drain regions 244a-b and 246a-b may then be formed in semiconductor layer 240 by any of a number of methods (e.g., ion implantation; ion shower; gas immersion laser deposition; printing or depositing a heavily doped semiconductor layer on semiconductor layer 240 and gate 260, followed by a curing and/or activation step; printing or depositing one or more dopant layers [for example, layers 270a and 270b, which may represent two different layers containing complementary dopants] on semiconductor layer 240 and gate 260, followed by a drive-in step, etc.; see, e.g., U.S. Pat. Nos. 7,619,248 and 7,701,011, and U.S. patent application Ser. No. 11/888,942, filed Aug. 3, 2007, the relevant portions of each of which are incorporated herein by reference). Channel regions 242a-b remain under the gates 260a-b after formation of the source and drain regions 244a-b and 246a-b.

Regions of the gate dielectric layers 250a-b exposed by (i.e., not covered by) the gates 260a-b can be removed, either before or after formation of the source and drain regions 244a-b and 246a-b, typically by selective wet or dry etching. If the source and drain regions 244a-b and 246a-b are formed by printing or depositing a dopant layer on semiconductor layer 240 and gate 260, followed by drive-in and/or activation steps, then the dopant layer is typically removed prior to further processing (and optionally, prior to removing the exposed gate dielectric layer).

One or more dielectric layers 270 (e.g., first and second interlayer dielectrics 270a and 270b) are then deposited onto the gates 260a-b and the source and drain regions 244a-b and 246a-b, generally by blanket deposition or printing (as described herein). In some embodiments, the dielectric layer is formed by printing an ink containing one or more dielectric precursors and one or more solvents. Generally, the dielectric precursor(s) include a source of silicon dioxide, silicon nitride, silicon oxynitride, an aluminate, a titanate, a titanosilicate, zirconia, hafnia, or ceria. In other embodiments, the dielectric precursor is an organic polymer or precursor thereof (e.g., a polymer or copolymer of acrylic acid, methacrylic acid, and/or an ester of acrylic acid and/or methacrylic acid). After printing, the dielectric ink(s) are then dried and cured. Drying the printed ink may comprise heating to a temperature of from 50 to 150° C. under vacuum or in an inert or oxidizing atmosphere for a length of time sufficient to remove substantially all of the solvent from the printed ink. Curing the dried dielectric precursor(s) may comprise heating to a temperature of, e.g., from 200 to 500° C. (or any range of values therein) in an inert or oxidizing atmosphere, for a length of time sufficient to convert the precursor(s) to the desired dielectric material.

Furthermore, contact holes (not shown) may be opened in the dielectric layers 270a-b, and metal lines and/or interconnects (not shown) connecting one or more additional devices to the gate 260a/b and source/drain terminals 244a/b and 246a/b (e.g., of TFT 245) may also be formed. Alternatively, when the dielectric layers 270a-b are formed by printing, the printed pattern may include a plurality of contact holes exposing a surface of each of the gates 260a-b and source/drain terminals 244a-b and 246a-b. In one embodiment, the metal lines/interconnects are formed by printing (see, e.g., U.S. patent application Ser. No. 12/175,450, filed Jul. 17, 2008, and U.S. patent application Ser. No. 12/131,002, filed May 30, 2008, the relevant portions of each of which are incorporated herein by reference). In one example, a seed layer of a conductive material is printed substantially in the pattern of the metal lines and/or interconnects, and a bulk metal or metal alloy is plated thereon (e.g., by electroplating or electroless plating). Alternatively, the metal lines and/or interconnects are formed by conventional thin-film and/or blanket deposition and photolithography processes.

TFT 245 may be an NMOS transistor or a PMOS transistor, and may be electrically connected and/or configured to function as, e.g., a transistor, a diode, a resistor, a capacitor, or an off-connected TFT. Exemplary TFT 245 has been shown in FIG. 2E with features having a dome-shaped profile (see, e.g., U.S. patent application Ser. No. 12/243,880, filed Oct. 1, 2008, the relevant portions which are incorporated herein by reference). In general, the semiconductor islands (e.g., 240a and/or 240b; FIG. 2D) and the gate (e.g., 260a and/or 260b; FIG. 2E) can have a dome-shaped profile when formed by printing. However, each of the fabricating steps in an "all-printed" scheme for making TFTs such as TFT 245 may have some variability associated therewith, and thus, the dimensions, borders, and surfaces of TFT 245 may vary. Accordingly, the cross-sectional and/or layout (top-down) shape and/or profile of each printed feature may vary across the feature.

Thus, in one embodiment, TFT 245 may be made by an "all printed" process. In embodiments that employ printing one or more layers of TFT 245, the printed precursor ink(s) is generally dried and cured. The lengths of time and the temperatures at which the ink is dried and the dried precursor(s) are cured depend upon the particular ink formulation and the particular precursor(s), but in general, the ink is dried at a temperature and for a length of time sufficient to remove substantially all of the solvent from the printed ink, and the dried precursor(s) are cured at a temperature and for a length of time sufficient to convert the precursor(s) to the material of the final film (e.g., a semiconductor, dielectric or metal). Additional description of exemplary printed TFTs and methods of making such printed TFTs are described in U.S. patent application Ser. No. 11/805,620, filed May 23, 2007, and U.S. patent application Ser. No. 12/243,880, filed Oct. 1, 2008, the relevant portions of each of which are incorporated herein by reference. Alternatively, TFT 245 may be made by a process employing a mixture of printing and conventional processing steps, or by conventional processing (e.g., thin film) techniques alone.

As mentioned above, "bottom gate" devices can be formed on the coated substrate. After forming gate electrodes 240a-b (FIG. 2D), a gate dielectric layer can be formed thereon by one or more of the methods described above with regard to layer 250a-b in FIG. 2E. Transistor bodies (analogous to layer 260a-b in FIG. 2E) can be formed over the gate dielectric layer and doped in accordance with known processes (see, e.g., U.S. patent application Ser. Nos. 11/243,460 and 12/109,338, respectively filed on Oct. 3, 2005, and Apr. 24, 2008, the relevant portions of which are incorporated herein by reference). A bulk dielectric layer similar to layer 270a-b in FIG. 2E can be formed and/or patterned as disclosed herein, and contact holes can be formed therein and interconnects formed in contact with underlying device layers (e.g., the gate electrode and the source and drain terminals of the transistor body) as disclosed herein.

In further alternative embodiments, devices on the diffusion barrier layer-coated metal substrate can include one or more capacitors, diodes, resistors and/or interconnects. The capacitor(s) generally comprise first and second capacitor plates and a dielectric material between the first and second capacitor plates. The diode(s) generally comprise a plurality of diode layers (e.g., from 2 to 5 layers) of conductive or semiconductive material having different doping types and/or levels. For example, in a two-layer diode, a first layer may comprise or consist essentially of a P-type semiconductor, and a second layer may comprise or consist essentially of an N-type semiconductor; in a three-layer diode, a first layer may comprise or consist essentially of a heavily-doped P-type semiconductor, a second layer may comprise or consist essentially of an intrinsic semiconductor or a lightly doped P-type or N-type semiconductor, and a third layer may comprise or consist essentially of a heavily-doped N-type semiconductor. In the exemplary diode, any of the P-type or N-type semiconductor layers may comprise or consist essentially of a plurality of sublayers having different doping levels (e.g., one or more heavily-doped or very heavily-doped layers and one or more lightly-doped or very lightly-doped layers). The resistor(s) and/or interconnect(s) are generally formed in a pattern on the coated substrate and/or a device layer thereon. The capacitor plates, resistor(s) and/or interconnect(s) may comprise a semiconductor and/or a conductive material as disclosed herein, and the diode layers generally comprise a semiconductor material as disclosed herein. The capacitor plates, diode layers, resistor(s) and/or interconnect(s) may be formed by any of the processes disclosed herein.

Figure 3A:
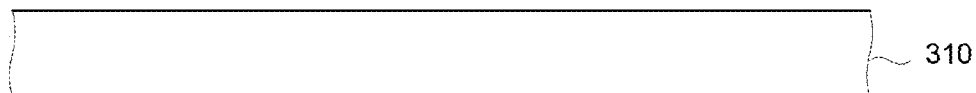
FIGS. 3A-3C illustrate an exemplary alternative method for forming a diffusion barrier layer on a metal substrate.
Figure 3B:
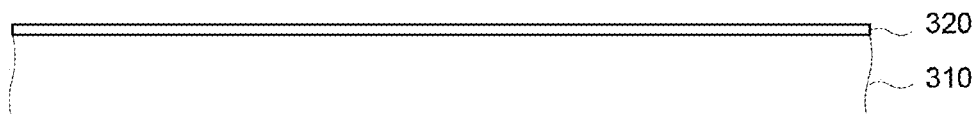
Figure 3C:
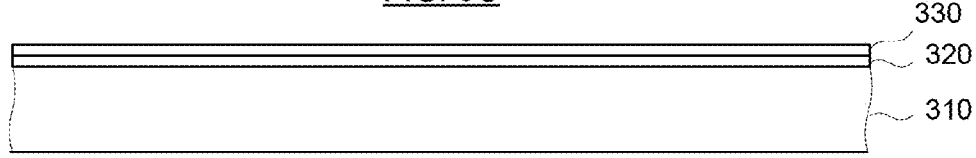

In an alternative embodiment, as shown in FIGS. 3A-C, the metal substrate 310 may have a diffusion barrier layer 320 deposited on one major surface of metal substrate 310 (see, e.g., FIG. 3B), generally by one or more processes described herein. In additional embodiments (not shown), at least one (but less than all) of the surfaces of the metal substrate 310 may be coated by diffusion barrier layer 320. For example, in processing a stock roll or sheet from which metal substrate 310 is formed, diffusion barrier layer 320 may coat opposite sides of metal substrate 310 (e.g., the main faces of metal substrate 310 upon which semiconductor features or devices may later be formed), but may not coat one or more edges of metal substrate 310. Alternatively, metal substrate 310 may be formed or cut prior to or after a cleaning process, then diffusion barrier layer 320 may be formed to coat a single major surface of metal substrate 310 along with the edges.

As shown in FIG. 3C, in embodiments where diffusion barrier layer 320 is deposited on one major surface of the metal substrate 310, an insulator layer 330 may be deposited to cover those areas of metal substrate 310 coated with diffusion barrier layer 320, generally by one or more processes described herein. In additional embodiments (not shown), where at least one, but less than all of the surfaces of the metal substrate 310 are coated with the diffusion barrier layer 320, those areas coated with the diffusion barrier layer 320 may be subsequently coated with the insulator layer 330 (e.g., a top face and the sides of metal substrate 310 may be covered by diffusion barrier layer 320 and insulator layer 330).

Exemplary Barrier-Coated Metal Substrates with Anti-Reflective Properties

Figure 4A:
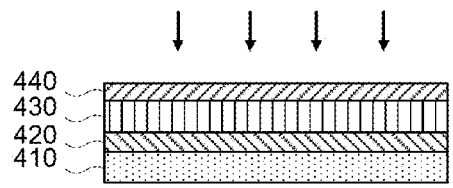
FIGS. 4A-4B illustrate structures formed in a further exemplary method for manufacturing a diffusion barrier-coated metal substrate according to embodiments of the invention.
Figure 4B:
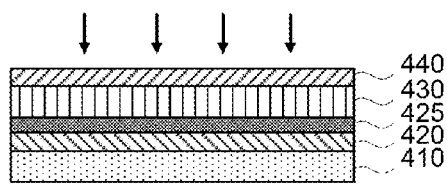

One issue that may arise with use of metal foil substrates includes a relatively high reflectance of the metal substrate and/or barrier layer(s) (see FIGS. 4A-4B). For instance, the optical constants and thicknesses of the constituent film stack (e.g. a metal-barrier-insulator stack, typically comprising a metal foil 410, one or more layers of diffusion barrier material(s) 420/425 and one or more insulator layers 430) may interact to absorb or reflect light to varying degrees, depending on the wavelength of light used to process the device, and to a lesser extent, the angle of the incident light.

In particular, use of visible light wavelengths (e.g., in lasers and/or other high intensity light sources such as flash lamps) to crystallize a silicon or other electrical device layer 440 deposited on a metal-barrier-insulator stack can result in significant transmission through the silicon film 440. The light passing through the silicon film 440 may be at least partially reflected back from the metal foil 410 and/or the barrier layer(s) (e.g., 420 in FIG. 4A). The silicon film 440 may have a variable light absorption due to the relatively high sensitivity to light interactions (e.g., direct absorption of light and/or absorption of light reflected from underlying layers) due to a non-optimal and/or non-uniform layer thickness, both of the silicon film 440 itself and the constituent layers in the metal-barrier-insulator stack. The sensitivity of the silicon film 440 to such light interaction can result in significant variation of crystallization uniformity and grain structure, resulting in undesirable device variations across a given substrate and between different substrates (e.g., within a processing lot). This effect is of particular concern using aluminum nitride (an excellent diffusion barrier) in combination with lasers emitting light in the visible spectrum (e.g., green wavelengths) for silicon crystallization.

To reduce, minimize or nullify the effects of variable light absorption due to the relatively high sensitivity to light interactions in the silicon film, one or more antireflective layers (e.g., layer 425 in FIG. 4B) may be formed on the first barrier layer 420 as part of the metal-barrier-insulator stack. Alternatively, the antireflective layer(s) 425 can be formed on the metal substrate 410 or the insulator layer(s) 430. The material(s) of the antireflective layer(s) 425 may be selected such that its/their reflectivity is low at the wavelengths of the light used for silicon crystallization. Alternatively, the material(s) of the antireflective layer(s) 425 may be selected such that its/their reflectivity is low at wavelengths useful for a photovoltaic (PV) cell. The antireflective layer(s) 425 may be deposited as part of the diffusion barrier 420 (e.g., resulting in a barrier/antireflective bilayer 420/425), enhancing its use and widening the process window for crystallization and device yield and/or performance. Ideally (but not necessarily), the antireflective layer(s) 425 may be deposited in one process sequence using the same deposition tool (e.g., an atomic layer deposition tool, integrated CVD-sputter cluster tool, a spin-on-glass and curing apparatus, etc.) as for the barrier layer 420 and/or the insulator film 430.

It is advantageous if a single layer has both antireflective properties and diffusion barrier properties (e.g., it acts as a barrier of outdiffusion of impurities from the underlying metal substrate 410), but this is not a requirement of the present invention. In other words, the barrier layer(s) in the metal-barrier-insulator stack may comprise (i) one or more layers with solely diffusion barrier properties and at least one layer with antireflective properties, (i) one or more layers with solely antireflective properties and at least one layer with solely diffusion barrier properties, (iii) one or more layer(s) with both diffusion barrier and antireflective properties, or (iv) any combination thereof. The anti-reflective coating (ARC) layer may be insulating as well (for example, silicon oxynitride [where the Si:O:N ratio may be tailored], a high k film such as $TiO_2$, alumina, $ZrO_2$ and/or other metal oxides), depending on the desired optical properties for the layer.

Figure 5:
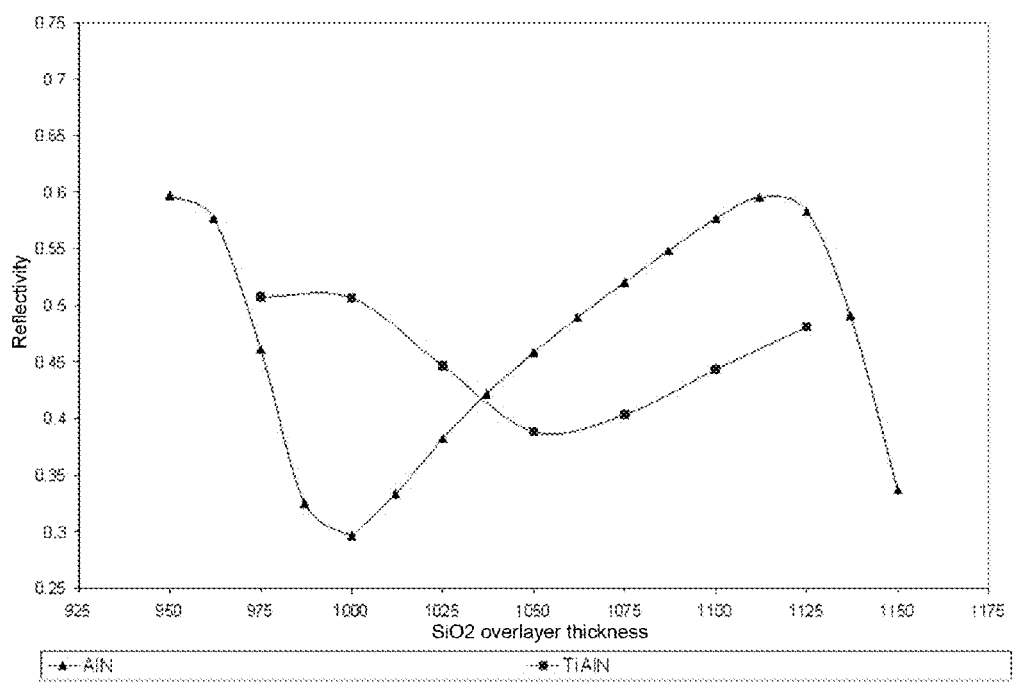
FIG. 5 is a graph showing the reduction in reflectivity of MN and TiN layers under a $SiO_2$ layer as a function of $SiO_2$ layer thickness.

In particular, titanium nitride (or, for example, silicon oxynitride) can be used as an antireflective film 425, either by itself or in conjunction with an aluminum nitride film 420. The film can be deposited in a bilayer barrier stack (e.g., a metal substrate 410-AlN 420-TiN 425-insulator layer 430 stack, or a metal substrate-TiN-AlN-insulator stack), or in an alternating nanolaminate fashion (e.g., a metal substrate-nanolaminate-insulator stack, where each layer of the nanolaminate constitutes one or more monolayer(s) of AlN or one or more monolayers of TiN, and the number of nanolaminate layers may be from 1 to 10,000). One may empirically determine a thickness that maximizes the efficiency of the nanolaminate for use as a barrier and as an antireflective coating. A typical thickness for the nanolaminate is 1-100 nm (or any range of values therein). As illustrated in FIG. 5, use of a TiN-AlN nanolaminate results in a 75% decrease in reflectivity, allowing for reduced optical coupling and stack sensitivity during laser crystallization, as compared to pure AlN (or similar materials). In turn, the reduced optical coupling and stack sensitivity results in more uniform crystallization and/or other improved qualities of the silicon film.

The use of antireflective materials (such as titanium nitride) in conjunction with a visible wavelength (e.g., green) light source for crystallizing a silicon or other device layer may be specifically tuned to for any wavelength of light (or light source). Such tuning includes the use of appropriate materials with desired antireflective properties that are also compatible within the overall device integration scheme.

Exemplary Barrier-Coated Metal Substrates with Stress Relief Properties

Another issue that may arise with use of metal foil substrates is the possible grain highlighting in the metal substrate, generally due to stress. Grain highlighting can affect subsequent processing steps. Some barrier materials may have high inherent stress, and the barrier layer stack and/or composition may be optimized to take this into account.

To effectively passivate a substrate comprising a metal foil (e.g., substrate 210 in FIG. 2A) and eliminate direct (via outdiffusion) or indirect (e.g., via contact with process tools, baths etc., which may come in contact with an unencapsulated metal foil substrate 210) contamination, the diffusion barrier (e.g., layer 220 in FIG. 2A) should encapsulate all exposed surfaces of the substrate 210, including the substrate edges. The dimensions, composition and/or physical, chemical and/or mechanical properties of the diffusion barrier 220 can also be optimized to reduce processing issues due to optical reflectivity of the metal substrate 210 and/or one or more of the barrier layers (e.g., 420 and/or 425 in FIGS. 4A-4B).

A titanium nitride film (e.g., layer 220 in FIG. 2A) as a metal diffusion barrier can be directly deposited on a stainless steel substrate 210, with complete encapsulation that includes all sides and edges of the substrate 210. In some embodiments (e.g., when the barrier film is deposited by ALD), an adhesion layer may be formed on the substrate 210 prior to deposition of the barrier layer 220, depending on process requirements. This may be followed by encapsulation with an insulator layer 230 in a similar fashion (e.g., a nominal one-micron-thick silicon dioxide layer). Cleaning of the substrate 210 (e.g., removal of residue, organics, particles, etc.) prior to deposition of the barrier layer 220 is preferred to enable good adhesion of the barrier layer 220 at high temperature. At high temperatures (e.g., as tested with multiple heating cycles at 850° C. for a duration on the order of hours), a TiN barrier 220 effectively prevents diffusion of iron and chromium (the principal and fastest diffusing constituents of a steel substrate 210) into active silicon TFT devices on the surface of the $SiO_2$ insulator layer 230 (see, e.g., FIG. 5). Diffusion of nickel and other alloying elements in the stainless steel, such as Co, Mo, Ti, Nb, etc., to the surface of the insulator layer 230 (and thus, into an overlying device layer) is also prevented.

In one embodiment, the barrier layer comprises a first layer of AlN to act as an adhesion layer, a layer of $SiO_2$:Al to act as a stress relief layer, and then a layer of AlN as the diffusion barrier. The first AlN layer typically has a thickness of 10-100 Angstroms, although any thickness within the range of 10-5000 Å is acceptable. The stress relief layer (e.g., $SiO_2$:Al) may have a thickness of 10-500 Angstroms, although any thickness within the range of 10-5000 Å is acceptable. Preferably, the stress relief layer is deposited by ALD. The second AlN layer typically has a thickness of 200-2000 Angstroms, although any thickness within the range of 50-10,000 Å is acceptable. Alternatives to the adhesion and stress relief layers recited in this paragraph include $Al_2O_3$, silicon nitride, silicon oxynitride, silicon oxide, titanium oxide, oxides of zirconium, hafnium, or rare earth metals, or a combination or alloy thereof, in a thickness range similar to those mentioned above. Choice of material(s) and dimension(s) may be based on the desired material properties and compatibility with the overall process integration scheme.

As stated above, other materials that can act as a diffusion barrier include TiN and TiAlN (where the ratio of Ti to Al may depend on the application; e.g., the stress and the reflectance of the diffusion barrier film stack can be adjusted by changing the ratio of Ti to Al). The TiN and/or TiAlN films can be deposited by any of a variety of methods, such as sputtering (with or without an optional sputter etch of the steel surface prior to deposition) or chemical vapor deposition (CVD), with atomic layer deposition (ALD) being a preferred technique. These stress relief and/or additional diffusion barrier layers provide adequate protection to the device (e.g., TFT 245 in FIG. 2E) during multiple thermal cycles at a temperature of up to 850° C. This approach can be combined with insulating coatings (e.g., $SiO_2$ and/or $Al_2O_3$), preferably in the same deposition apparatus (or optionally a separate deposition process), to electrically isolate the substrate 210 and barrier layer 220 from the device layer (e.g., 240 in FIGS. 2D-2E).

The diffusion barrier layer may also provide introduce one or more processing issues. For example, the metal nitride films (or, alternatively, a metal carbide, a silicon nitride or silicon carbide film) may have significant stress or impart significant stress on other layers in the device. This stress can lead to delamination of the film or deformation of the underlying steel substrate. This stress can be significantly reduced by including one or more additional materials in the film stack. Adding an oxide layer under the metal nitride, or creating a laminate such a TiN:AlN (where the ratio of the TiN layers to the AlN layers in the nanolaminate), allows stress relief. In one example, a block of 8 monolayers of TiN, followed by 3 monolayers of AlN (and repeated until the predetermined total film thickness is achieved), provides excellent stress relief and diffusion barrier properties, although any number of alternating monolayers of TiN to AlN (e.g., from 5-100 monolayers of TiN to 1-50 monolayers of AlN) are acceptable. Without an underlying oxide stress relief layer, the AlN film (e.g., 420 in FIG. 4A) may delaminate from the substrate 410 at high temperatures. Thus, in one embodiment, the TFT devices (e.g., 245 in FIG. 2E) on stainless steel substrates can include a layer of sputtered TiN having a thickness of from about 1 nm to about 1000 nm (e.g., in one embodiment, about 100 Å), and a layer of TiAlN formed by ALD (as described herein) having a thickness of from about 10 nm to about 1500 nm (e.g., in one embodiment, about 300 nm).

The grains in the steel substrate and the high reflectivity of the steel substrate can make it challenging to optically inspect or align the steel foil substrate at subsequent process steps. The high reflectivity of the substrate can also cause issues with laser processing during crystallization. This reflectance can cause variations in the radiation dose at the surface of the film stack, due to the reflected laser energy interfering with the incident laser energy, causing standing waves with nodes of higher/lower energy. To reduce the impact of these effects, the thickness and composition of the diffusion barrier layer can be optimized to make it more opaque optically, and to minimize reflectivity from the surface of one or more underlayers and/or from the surface of the metal substrate.

TiN and its alloys are relatively cheap, are frequently single layered, and are often amenable to different methods of deposition (e.g., dual-sided deposition, in many embodiments). Metal films other than TiN for use in the present diffusion barrier-coated substrate can be found in Afentakis et al., *IEEE Transactions on Electron Devices*, vol. 53, no. 4 (April 2006), p. 815, the relevant portions of which are incorporated herein by reference.

CONCLUSION/SUMMARY

Thus, the present invention provides semiconductor devices on diffusion barrier layer coated substrates. The present invention advantageously prevents diffusion of metal atoms from a metal substrate having a diffusion barrier layer thereon into a semiconductor device formed on the metal substrate.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A device, comprising:
   a) a metal substrate containing iron, chromium, nickel, molybdenum, niobium, cobalt and/or titanium;
   b) one or more diffusion barrier layers on said metal substrate, wherein at least one of said diffusion barrier layers comprises a compound of the formula $Ti_xN_y$, where the ratio of x to y is from about 3:4 to about 3:2, or $Ti_aAl_bN_c$, where the ratio of (a+b) to c is from about 3:4 to about 3:2, and said one or more diffusion barrier layers have a total thickness of from 300 Å to less than 1000 Å;
   c) one or more insulator layers on said one or more diffusion barrier layers, said insulator layer(s) electrically isolating said one or more diffusion barrier layers from electrical devices and electrical device features subsequently formed on said one or more insulator layers; and
   d) a semiconductor layer on said one or more insulator layers, wherein the semiconductor layer comprises silicon.

2. The device of claim 1, wherein at least one of said one or more diffusion barrier layers and at least one of said one or more insulator layers encapsulate said metal substrate.

3. The device of claim 1, wherein at least one of said one or more diffusion barrier layers and at least one of said one or more insulator layers coat at least one side of said metal substrate.

4. The device of claim 1, wherein said metal substrate comprises a foil or sheet of aluminum, copper, titanium, stainless steel or molybdenum.

5. The device of claim 1, wherein said metal substrate has a thickness of from about 10 μm to about 1000 μm.

6. The device of claim 1, wherein at least one of said one or more diffusion barrier layers comprises TiN.

7. The device of claim 1, wherein said one or more diffusion barrier layers comprises AlN.

8. The device of claim 1, wherein said one or more insulator layers comprises silicon oxide, silicon nitride, silicon oxynitride, aluminum oxide, or a combination thereof.

9. The device of claim 8, wherein said one or more insulator layers have a thickness of from about 100 nm to about 10 μm.

10. The device of claim 1, wherein said semiconductor layer comprises silicon and germanium.

11. The device of claim 1, wherein said semiconductor layer comprises polycrystalline silicon and/or germanium.

12. The device of claim 11, wherein said semiconductor layer further comprises a dopant selected from the group consisting of B, P, As, and Sb.

13. The device of claim 1, further comprising a gate electrode on or under said semiconductor layer, the gate electrode comprising a gate and a gate dielectric layer.

14. The device of claim 1, wherein said semiconductor layer has a first dopant therein with a first conductivity type, and the device further comprises a second semiconductor layer on or over said semiconductor layer, said second semiconductor layer having a second dopant therein with a second conductivity type.

15. The device of claim 1, further comprising a first conductive layer on or over the semiconductor layer, the first conductive layer being selected from the group consisting of a first metal layer and a first heavily doped semiconductor layer.

16. The device of claim 15, further comprising a dielectric layer on said first conductive layer, and a second conductive layer on said first conductive layer, said second conductive layer being selected from the group consisting of a second metal layer and a second heavily doped semiconductor layer.

17. The device of claim 1, further comprising an antireflective layer on or over said metal substrate.

18. The device of claim 17, wherein said semiconductor layer is over said antireflective layer.

19. The device of claim 1, further comprising a stress relief layer on or over said metal substrate.

20. The device of claim 1, wherein said one or more insulator layers cover all areas of said metal substrate covered by said one or more diffusion barrier layers.

21. The device of claim 8, wherein said one or more insulator layers comprises a silicon aluminum oxide.

22. A method of making a device on a metal substrate, comprising:
   a) forming one or more diffusion barrier layers on said metal substrate, wherein said metal substrate contains iron, chromium, nickel, molybdenum, niobium, cobalt and/or titanium, at least one of said diffusion barrier layer(s) comprises a compound of the formula $Ti_xN_y$, or $Ti_aAl_bN_c$, where the ratio of x to y is from about 3:4 to about 3:2 and the ratio of (a+b) to c is from about 3:4 to about 3:2, and said one or more diffusion barrier layers have a total thickness of from 300 Å to less than 1000 Å;
   b) forming one or more insulator layers on said diffusion barrier layer(s), said insulator layer(s) electrically isolating said diffusion barrier layer(s) from electrical devices and electrical device features subsequently formed on said insulator layer(s); and
   c) forming a semiconductor layer on said one or more insulator layers, wherein the semiconductor layer comprises silicon.

23. The method of claim 22, wherein at least one of said one or more diffusion barrier layers and at least one of said one or more insulator layers encapsulate said metal substrate.

24. The method of claim 22, wherein at least one of said one or more diffusion barrier layers and at least one of said one or more insulator layers coat at least one side of said metal substrate.

25. The method of claim 22, further comprising cleaning said metal substrate prior to forming said one or more diffusion barrier layers.

26. The method of claim 25, wherein cleaning said metal substrate comprises sputter etching said metal substrate.

27. The method of claim 22, wherein said metal substrate comprises a foil or sheet of aluminum, copper, titanium or stainless steel.

28. The method of claim 22, wherein said metal substrate has a thickness of from about 10 μm to about 1000 μm.

29. The method of claim 22, wherein forming said one or more diffusion barrier layers comprises physical vapor deposition, atomic layer deposition, or chemical vapor deposition of a titanium compound.

30. The method of claim 29, wherein forming said one or more diffusion barrier layers comprises atomic layer deposition.

31. The method of claim 29, wherein said compound comprises TiN.

32. The method of claim 22, where said compound comprises AlN.

33. The method of claim 22, wherein said one or more insulator layers comprise silicon oxide, silicon nitride, silicon oxynitride, aluminum oxide, or a combination thereof.

34. The method of claim 33, wherein forming said one or more insulator layers comprises depositing at least one of said one or more insulator layers by physical vapor deposition, chemical layer deposition or atomic layer deposition.

35. The method of claim 33, wherein forming said one or more insulator layers comprises printing an insulator ink and/or an insulator precursor.

36. The method of claim 33, wherein said one or more insulator layers have a thickness of from about 100 nm to about 10 µm.

37. The method of claim 22, wherein said semiconductor layer comprises silicon and germanium.

38. The method of claim 37, wherein said semiconductor layer further comprises a dopant selected from the group consisting of B, P, As, and Sb.

39. The method of claim 37, further comprising forming a gate electrode on or under said semiconductor layer, the gate electrode comprising a gate and a gate dielectric layer.

40. The method of claim 22, wherein said semiconductor layer has a first dopant therein with a first conductivity type, and the device further comprises a second semiconductor layer on or over said semiconductor layer, said second semiconductor layer having a second dopant therein with a second conductivity type.

41. The method of claim 22, further comprising a first conductive layer on or over the semiconductor layer, the first conductive layer being selected from the group consisting of a first metal layer and a first heavily doped semiconductor layer.

42. The method of claim 41, further comprising a dielectric layer on said first conductive layer, and a second conductive layer on said first conductive layer, said second conductive layer being selected from the group consisting of a second metal layer and a second heavily doped semiconductor layer.

43. The method of claim 37, further comprising irradiating said semiconductor layer to at least partially crystallize said semiconductor layer.

44. The method of claim 22, further comprising forming an antireflective layer on or over said metal substrate.

45. The method of claim 44, wherein said semiconductor layer is formed over said antireflective layer.

46. The method of claim 22, further comprising forming a stress relief layer on or over said metal substrate.

47. The method of claim 46, wherein said stress relief layer is formed on said metal substrate, said method further comprises forming an antireflective layer on said stress relief layer, and said one or more diffusion barrier layers are formed on or over said antireflective layer.

48. The method of claim 33, wherein said one or more insulator layers comprises a silicon aluminum oxide.

* * * * *